United States Patent
Lee et al.

(10) Patent No.: US 9,520,415 B2
(45) Date of Patent: Dec. 13, 2016

(54) DISPLAY DEVICE AND METHOD OF FABRICATING THE SAME

(71) Applicant: Samsung Display Co., Ltd., Yongin, Gyeonggi-Do (KR)

(72) Inventors: Jung-Soo Lee, Seoul (KR); Jung suk Bang, Seoul (KR); JeongMin Park, Seoul (KR); Jinho Ju, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 2 days.

(21) Appl. No.: 14/451,251

(22) Filed: Aug. 4, 2014

(65) Prior Publication Data

US 2015/0187802 A1 Jul. 2, 2015

(30) Foreign Application Priority Data

Dec. 27, 2013 (KR) .................... 10-2013-0165556

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| H01L 27/12 | (2006.01) |
| H01L 29/786 | (2006.01) |

(52) U.S. Cl.
CPC ......... *H01L 27/124* (2013.01); *H01L 27/1248* (2013.01); *H01L 27/1288* (2013.01); *H01L 29/78633* (2013.01)

(58) Field of Classification Search
CPC .............. H01L 27/124; H01L 27/1248; H01L 29/78633; H01L 27/1288; H01L 29/7869; H01L 29/4908; H01L 29/458
See application file for complete search history.

(56) References Cited

U.S. PATENT DOCUMENTS

| | | | |
|---|---|---|---|
| 6,900,856 B2 | 5/2005 | Kim et al. | |
| 8,199,302 B2 | 6/2012 | Hong | |
| 2002/0151174 A1* | 10/2002 | Jeong | ................ G02F 1/13458 438/686 |
| 2004/0165122 A1* | 8/2004 | Song | ................ G02F 1/136209 349/43 |
| 2005/0093029 A1* | 5/2005 | Kim | .................. H01L 29/66765 257/262 |
| 2007/0218601 A1* | 9/2007 | Seo | ..................... H01L 29/4908 438/151 |
| 2008/0145980 A1* | 6/2008 | Kim | .................... G02F 1/13458 438/160 |

(Continued)

FOREIGN PATENT DOCUMENTS

| | | |
|---|---|---|
| JP | 9-15625 A | 1/1997 |
| JP | 9-90415 A | 4/1997 |

(Continued)

*Primary Examiner* — Thanh Y Tran
(74) *Attorney, Agent, or Firm* — Knobbe Martens Olson & Bear LLP

(57) ABSTRACT

A display device and method of fabricating the same are disclosed. In one aspect, the display device includes a substrate, a black matrix formed over the substrate, and a transparent electrode formed over the substrate. The black matrix and the transparent electrode have first and second areas, respectively. The sum of the first and second areas is substantially equal to the surface area of the substrate.

13 Claims, 9 Drawing Sheets

(56) References Cited

U.S. PATENT DOCUMENTS

2011/0273412 A1 11/2011 Lee et al.
2012/0038867 A1 2/2012 Kwon et al.

FOREIGN PATENT DOCUMENTS

| KR | 10-0754125 B1 | 8/2007 |
| KR | 10-0924751 B1 | 11/2009 |
| KR | 10-2012-0090368 A | 8/2012 |

\* cited by examiner

DISPLAY DEVICE AND METHOD OF FABRICATING THE SAME

CROSS-REFERENCE TO RELATED APPLICATIONS

This U.S. non-provisional patent application claims priority under 35 U.S.C. §119 of Korean Patent Application No. 10-2013-0165556, filed on Dec. 27, 2013, the entire contents of which are hereby incorporated by reference.

BACKGROUND

Field

The described technology generally relates to a display device and a method of fabricating the same.

Description of the Related Technology

With the development of our information-dependent society, demand for flat display devices such as liquid crystal displays (LCDs), organic light-emitting diode (OLED) displays, and electrophoretic displays (EPD) has increased.

Due to this demand, research for reducing costs of fabricating such displays is being conducted actively as well.

SUMMARY OF CERTAIN INVENTIVE ASPECTS

One inventive aspect is a display device having reduced production costs.

Another aspect is a method of fabricating a display device having reduced production costs by reducing the number of masks.

Another aspect is a display device including: a substrate; a gate pattern including a gate electrode formed on the substrate, a gate line extending in a first direction, and a gate pad formed at one end of the gate line; a data pattern including a semiconductor pattern overlapping the gate electrode, a source electrode contacting a portion of the semiconductor pattern, a drain electrode contacting the remaining portion of the semiconductor pattern and spaced from the source electrode, a data line extending in a second direction intersecting the first direction, and a data pad formed at one end of the data line; a black matrix formed on the substrate having the gate pattern and the data pattern; and a transparent electrode formed on the substrate having the gate pattern and the data pattern, wherein as seen from a vertical direction of the substrate, the sum of an area that the black matrix occupies and an area that the transparent electrode occupies is identical to an area of the substrate.

In some embodiments, the display device can include a display area displaying an image and a non-display area displaying no image.

In some embodiments, the black matrix can be formed in a portion of the non-display area.

In some embodiments, the transparent electrode can be formed in the remaining portion of the non-display area and the display area.

In some embodiments, the devices can further include a first insulating layer formed between the gate pattern and the data pattern; and a second insulating layer formed on the first insulating layer.

In some embodiments, a contact hole overlapping a portion of the gate pad can be formed in the first insulating layer and the second insulating layer; and a drain contact hole overlapping a portion of the drain electrode and a data contact hole overlapping a portion of the data pad can be further formed in the second insulating layer.

In some embodiments, the transparent electrode can include: a pixel electrode connected to the drain electrode by the drain contact hole; a gate pad electrode connected to the gate pad by the gate contact hole; and a data pad electrode connected to the data pad by the data contact hole.

In some embodiments, the black matrix can be an organic black matrix.

Another aspect is a method of fabricating a display device, including: forming a gate pattern including a gate electrode, a gate line, and a gate pad on a substrate; forming a data pattern including a semiconductor pattern, a source electrode, a drain electrode, a data line, and a data pad on the substrate having the gate pattern; and forming a black matrix and a transparent electrode on the substrate having the gate pattern and the data pattern by using a first mask, wherein during the forming of the black matrix and the transparent electrode, as seen from a vertical direction of the substrate, the sum of an area that the black matrix occupies and an area that the transparent electrode occupies is identical to an area of the substrate.

In some embodiments, during the forming of the black matrix and the transparent electrode, the first mask can be a halftone mask or a slit mask.

In some embodiments, the forming of the black matrix and the transparent electrode can include: forming a black matrix layer on the substrate having the gate pattern and the data pattern; forming a black matrix pattern by etching a portion of the black matrix layer through the first mask; forming a black matrix by etching a portion of the black matrix pattern; forming a transparent electrode layer on the black matrix; forming a photoresist layer on the transparent electrode layer; forming a photoresist pattern exposing at least a portion of the transparent electrode layer on the black matrix by etching a portion of the photoresist layer; etching the exposed transparent electrode layer by using the photoresist pattern as a mask; and removing the photoresist pattern.

In some embodiments, the first mask can include a first area blocking all emitted light, a second area transmitting a portion of light and blocking the remaining portion of the light, and a third area transmitting all emitted light.

In some embodiments, the forming of the black matrix pattern can include forming a black matrix pattern including a first black matrix corresponding to the first area and a second black matrix corresponding to the second area.

In some embodiments, the forming of the black matrix can include etching a portion of the first black matrix and etching all the second black matrix.

In some embodiments, the methods can further include forming a first insulating layer between the gate pad and the data pad and forming a second insulating layer on the data pad and the first insulating layer.

In some embodiments, the forming of the black matrix pattern can include: forming a gate contact hole overlapping a portion of the gate pad by etching a portion of the first insulating layer and the second insulating layer; and forming a data contact hole overlapping a portion of the drain electrode and a data contact hole overlapping a portion of the data pad by etching a portion of the second insulating layer.

In some embodiments, the forming of the black matrix pattern can include etching a black matrix layer overlapping the drain contact hole, the gate contact hole, and the data contact hole.

In some embodiments, the forming of the black matrix pattern can include simultaneously etching a portion of the black matrix layer, the first insulating layer, and the second insulating layer.

In some embodiments, the forming of the photoresist layer on the transparent electrode layer can include planarizing the photoresist layer.

In some embodiments, the forming of the gate pattern can further include forming a capacitor electrode spaced from the gate electrode.

Another aspect is a display device, comprising a substrate, a gate pattern including i) a gate electrode formed over the substrate, ii) a gate line extending in a first direction, and iii) a gate pad formed at one end of the gate line, a data pattern including i) a semiconductor pattern at least partially overlapping the gate electrode, ii) a source electrode contacting a portion of the semiconductor pattern, iii) a drain electrode contacting another portion of the semiconductor pattern and spaced apart from the source electrode, iv) a data line extending in a second direction crossing the first direction, and v) a data pad formed at one end of the data line, a black matrix formed over the substrate and having a first area, and a transparent electrode formed over the substrate and having a second area. The sum of the first and second areas is substantially equal to the surface area of the substrate.

In the above device, the substrate comprises at least one display area configured to display an image and at least one non-display area. In the above device, the black matrix comprises a plurality of portions formed in the non-display area. In the above device, the transparent electrode comprises a plurality of portions formed in the display area and the remaining portions of the non-display area.

The above device further comprises a first insulating layer formed between the gate pattern and the data pattern, and a second insulating layer formed over the first insulating layer. In the above device, a contact hole overlapping a portion of the gate pad is formed in the first and second insulating layers, wherein a drain contact hole overlapping a portion of the drain electrode and a data contact hole overlapping a portion of the data pad are further formed in the second insulating layer. In the above device, the transparent electrode comprises a pixel electrode electrically connected to the drain electrode via the drain contact hole, a gate pad electrode electrically connected to the gate pad via the gate contact hole, and a data pad electrode electrically connected to the data pad via the data contact hole. In the above device, the black matrix is formed of an organic material. In the above device, the first area comprises a projection onto the substrate and wherein the second area comprises a projection onto the substrate.

Another aspect is a method of fabricating a display device, the method comprising forming a gate pattern including a gate electrode, a gate line, and a gate pad over a substrate. The method further comprises forming a data pattern including a semiconductor pattern, a source electrode, a drain electrode, a data line, and a data pad over the substrate. The method further comprises forming a black matrix and a transparent electrode over the substrate based on a single mask, wherein the black matrix has a first area and the transparent electrode has a second area, and wherein the sum of the first and second areas is substantially equal to the surface area of the substrate.

In the above method, the one mask is a halftone mask or a slit mask. In the above method, the forming of the black matrix and the transparent electrode comprises forming a black matrix layer over the substrate, etching one or more portions of the black matrix layer based on the mask so as to form a black matrix pattern, etching one or more portions of the black matrix pattern so as to form a black matrix, forming a transparent electrode layer over the black matrix, forming a photoresist layer over the transparent electrode layer, forming a photoresist pattern over the black matrix by etching a portion of the photoresist layer, wherein the photoresist pattern exposes one or more portions of the transparent electrode layer. The above method further comprises etching the exposed portions of the transparent electrode layer based on masking by the photoresist pattern and removing the photoresist pattern.

In the above method, the mask comprises a first area blocking emitted light, a second area transmitting a portion of light and blocking the remaining portion of the light, and a third area transmitting the emitted light. In the above method, the forming of the black matrix pattern comprises forming a black matrix pattern including a first black matrix corresponding to the first area and a second black matrix corresponding to the second area. In the above method, the forming of the black matrix comprises etching a portion of the first black matrix and the entire second black matrix.

The above method further comprises forming a first insulating layer between the gate pad and the data pad and forming a second insulating layer over the data pad and the first insulating layer. In the above method, the forming of the black matrix pattern comprises etching a portion of the first and second insulating layers so as to form a gate contact hole overlapping a portion of the gate pad by, and etching a portion of the second insulating layer so as to form a data contact hole overlapping a portion of the drain electrode and a data contact hole overlapping a portion of the data pad.

In the above method, the forming of the black matrix pattern comprises etching a black matrix layer overlapping the drain contact hole, the gate contact hole, and the data contact hole. In the above method, the forming of the black matrix pattern comprises substantially simultaneously etching a portion of the black matrix layer, the first insulating layer, and the second insulating layer.

In the above method, the forming of the photoresist layer comprises planarizing the photoresist layer.

In the above method, the forming of the gate pattern further comprises forming a capacitor electrode spaced apart from the gate electrode.

In the above method, the first area comprises a projection onto the substrate and wherein the second area comprises a projection onto the substrate.

Another aspect is a display device, comprising a substrate, a black matrix formed over the substrate and having a first area, and a transparent electrode formed over the substrate and having a second area, wherein the sum of the first and second areas is substantially equal to the surface area of the substrate.

In the above device, the first area comprises a projection onto the substrate and wherein the second area comprises a projection onto the substrate.

In the above device, the substrate comprises at least one display area configured to display an image and at least one non-display area, and wherein the black matrix comprises a plurality of portions formed in the non-display area. In the above device, the transparent electrode comprises a plurality of portions formed in the display area and the remaining portions of the non-display area.

DETAILED DESCRIPTION OF CERTAIN INVENTIVE EMBODIMENTS

Figure 1:
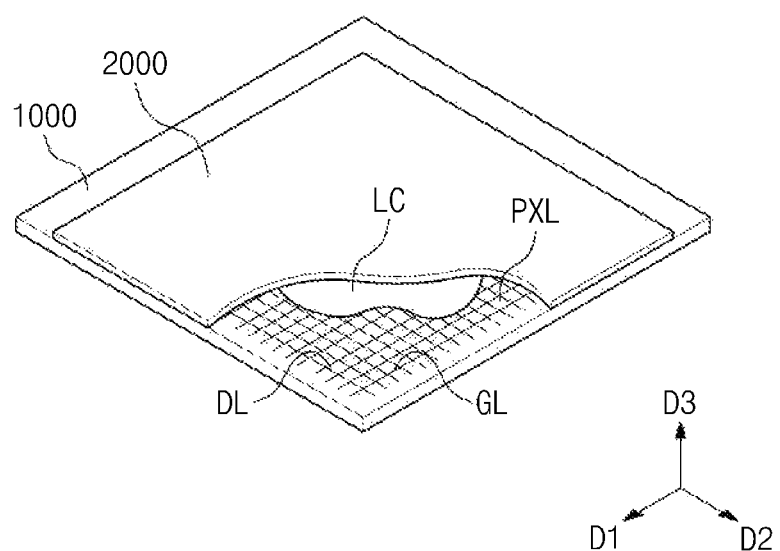
FIG. 1 is a perspective view illustrating a display device according to an embodiment.

Some embodiments of the described technology will be described below in more detail with reference to the accompanying drawings. The described technology can be embodied in different forms and should not be construed as limited to the embodiments set forth herein. Rather, these embodiments are provided so that this disclosure will be thorough and complete, and will fully convey the scope of the described technology to those skilled in the art.

In the drawings, the dimensions of layers and regions are exaggerated for clarity of illustration. Like reference numerals refer to like elements throughout. It will also be understood that when a layer (or film) is referred to as being 'on' another layer or substrate, it can be directly on the other layer or substrate, or intervening layers can also be present. Moreover, "formed on" can mean "formed over". In this disclosure, the term "substantially" means completely, almost completely or to any significant degree.

Hereinafter, a display device 10 according to an embodiment of the described technology is described with reference to the accompanying drawings.

The display device can include various display devices such as organic light-emitting diode (OLED) displays, liquid crystal displays (LCDs), plasma displays, electrophoretic displays, and electrowetting displays. Below, an LCD is used as one example of the display device 10.

Referring to FIG. 1, the display device 10 includes a thin film transistor (TFT) substrate 1000, a facing substrate 2000, and a liquid crystal layer LC.

The thin film transistor substrate 1000 includes a plurality of pixels PXL, which are defined by gate lines GL formed extending in a first direction D1 and data lines DL formed extending in a second direction D2 crossing (e.g., substantially perpendicular to) the first direction D1.

The facing substrate 2000 is formed over the thin film transistor substrate 1000. The liquid crystal layer LC is formed between the thin film transistor substrate 1000 and the facing substrate 2000.

Each pixel PXL includes at least one TFT and a pixel electrode to drive liquid crystal molecules. The facing substrate 2000 can include a common electrode and color filters that can represent the color of an image. The color filters and the common electrode can be formed on the thin film transistor substrate 1000.

The liquid crystal layer LC includes liquid crystal molecules having dielectric anisotropy. The liquid crystal molecules rotate in a predetermined direction between the thin film transistor substrate 1000 and the facing substrate 2000 when an electric field is applied between the pixel electrode and the common electrode. Accordingly, the electric field adjusts the transmittance of light incident to the liquid crystal layer LC.

Figure 2:
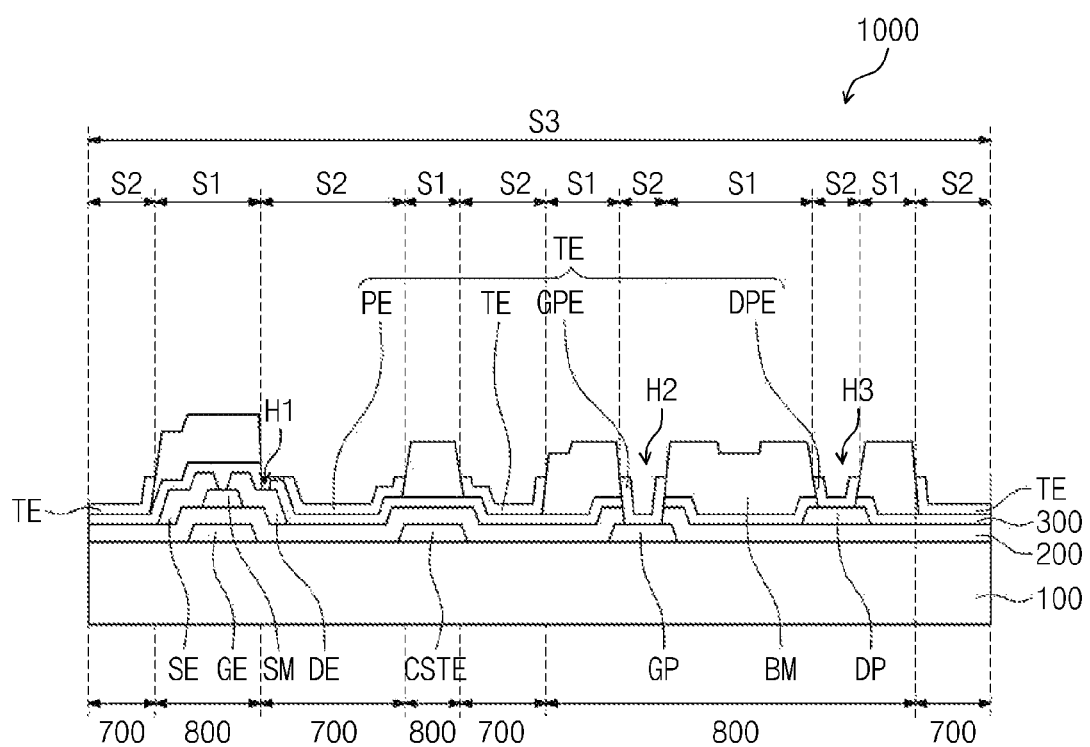
FIG. 2 is a sectional view illustrating a display device according to an embodiment.

FIG. 2 is a sectional view illustrating a portion of the thin film transistor substrate 1000 according to an embodiment.

Referring to FIGS. 1 and 2, the display device 10 includes a display area 700 for displaying an image and a non-display area 800 for not displaying any image.

The thin film transistor substrate 1000 includes a substrate 100, a gate pattern, a data pattern, a black matrix BM, and a transparent electrode TE. There can be a plurality of the black matrices BM and a plurality of the transparent electrodes TE.

The substrate 100 can be formed of a transparent insulating material. The pixels PXL can be formed in a matrix on the substrate 100.

The gate pattern is formed on the substrate 100 and includes a gate electrode GE, a gate line GL, and a gate pad GP. The data pattern includes a semiconductor pattern SM, a source electrode SE, a drain electrode DE, a data line DL, and a data pad DP.

The gate line GL extends in the first direction D1 on the substrate 100. The data line DL extends in the second direction intersecting the first direction and is substantially insulated from the gate lines GL.

The gate electrode GE protrudes from the gate line GL and is formed on the top surface of the substrate 100. The gate pad GP is formed at one end of the gate line GL and is formed on the top surface.

The gate pattern can further include a capacitor electrode CSTE spaced apart from the gate electrode GE.

The data pad DP is formed at one end of the data line DL and is formed on the top surface. The data pad DP is spaced apart from the gate pad GP.

A first insulating layer 200 is formed between the gate pattern and the data pattern. The gate line GL and the data line DL are substantially insulated from each other by the first insulating layer 200.

The semiconductor pattern SM is formed over the gate electrode GE with the first insulating layer 200 therebetween.

The source electrode SE and the drain electrode DE are formed on the first insulating layer 200 and the semiconductor pattern SM. The source electrode SE branches from the data line DL and overlaps a portion of the semiconductor pattern SM. The drain electrode DE is spaced apart from the source electrode SE and overlaps another portion of the semiconductor pattern SM.

A second insulating layer 300 is formed on the data pattern DP and the first insulating layer 200. The second insulating layer 300 can be formed of an organic insulating material or an inorganic insulating material.

A drain contact hole H1 and a gate control hole H2 can be formed in the first insulating layer 200 and the second insulating layer 300. A data contact hole H3 can be further formed in the second insulating layer 300. The drain contact hole H1 overlaps a portion of the drain electrode DE and electrically connects the drain electrode DE to the pixel electrode PE. The gate contact hole H2 overlaps a portion of the gate pad GP and electrically connects the gate pad GP to a gate pad electrode GPE. The data contact hole H3 overlaps a portion of the data pad DP and electrically connects the data pad DP to a data pad electrode DPE.

The black matrix BM can be formed on one or more portions of the non-display area 800. The black matrix BM can be formed of an organic material, but is not limited thereto.

The transparent electrode TE can be formed in the display area 700 and the one or more remaining portions of the non-display area 800. The transparent electrode TE can be formed of Indium Tin Oxide (ITO), Indium Zinc Oxide (IZO), Indium Gallium Zinc Oxide (IGZO), but is not limited thereto. The transparent electrode TE can include the pixel electrode PE electrically connected to the drain electrode DE through the drain contact hole H1, the gate pad electrode GPE electrically connected to the gate pad GP through the gate contact hole H2, and the data pad electrode DPE electrically connected to the data pad DP through the data contact hole H3.

When seen from a vertical direction D3 of the substrate 100, the sum of the area S1 that the black matrix BM occupies and the area S2 that the transparent electrode TE occupies can be substantially equal to the area S3 of the substrate 100. One mask can be used to form the black matrix BM and the transparent electrode TE so as to form the display device 10 such that the sum is substantially equal to the area S3.

Hereinafter, a display device fabricating method according to an embodiment is described.

Figure 3:
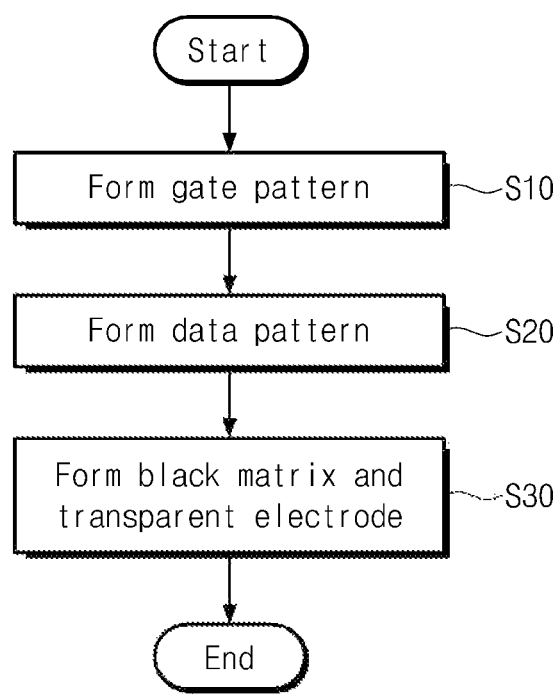
FIGS. 3 and 4 are flowcharts illustrating a display device fabricating method according to an embodiment.
Figure 4:
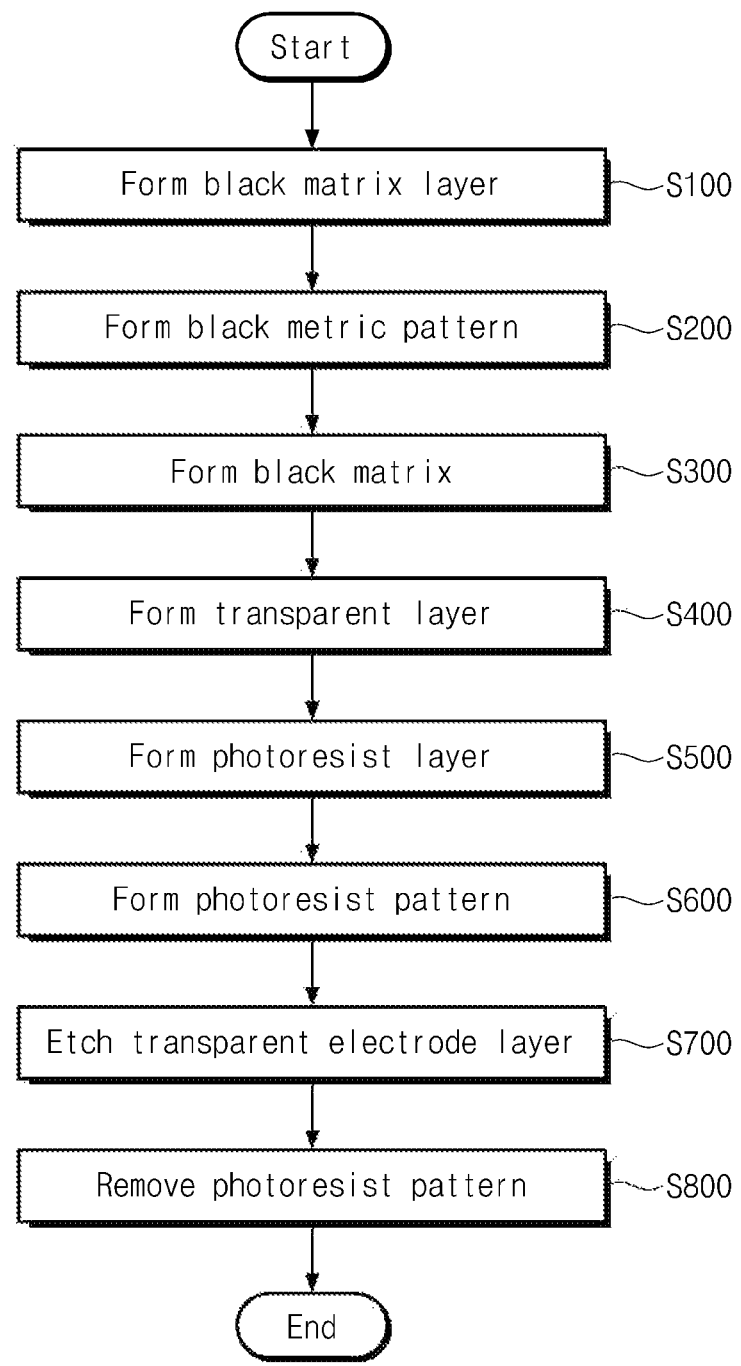

FIGS. 3 and 4 are flowcharts illustrating a display device fabricating method according to an embodiment. Depending on the embodiment, additional states can be added, others removed, or the order of the states changed in FIGS. 3 and 4.

FIGS. 5 to 12 are sectional views illustrating a display device fabricating method sequentially according to an embodiment.

Figure 5:
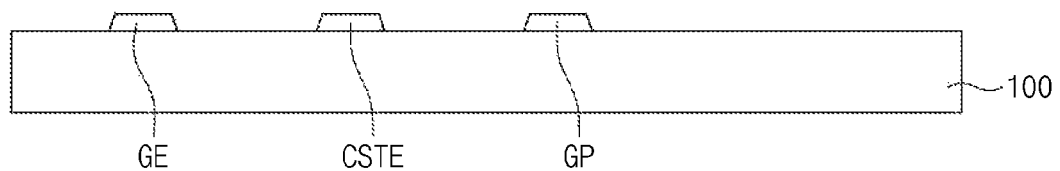
FIGS. 5 to 12 illustrate a display device fabricating method sequentially according to an embodiment.

Referring to FIGS. 3 and 5, in step S10, the gate electrode GE, the gate line GL, and the gate pad GP can be formed of a conductive material on the substrate 100. The conductive material is deposited on the front surface of the substrate 100 to form a conductive layer and a photolithography process is applied using a mask for the gate pattern (not shown). The conductive material can include metal such as copper (Cu), molybdenum (Mo), aluminum (Al), tungsten (W), and chromium (Cr). The conductive layer can be formed of a single layer, a multilayer, or an alloy layer. For example, a Mo—Al—Mo triple layer or a Mo—Al alloy layer can be used, but the conductive layer is not limited thereto.

In step S10, the capacitor electrode CSTE spaced apart from the gate electrode GE can be further formed. The thicknesses of each of the gate electrode GE, the capacitor electrode CSTE and the gate pad GP can be substantially the same. The widths thereof can also be substantially the same.

Figure 6:
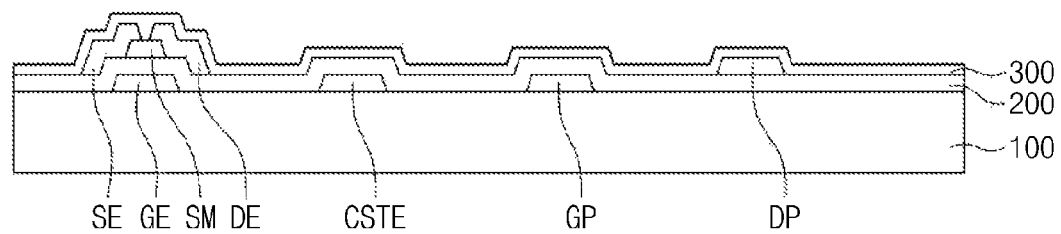

Referring to FIGS. 3 and 6, in step S20, the semiconductor pattern SM, the source electrode SE, the drain electrode DE, the data line DL, and the data pad DP are formed on the substrate 100 having the gate pattern. The data pattern can be formed by applying a photolithography process using a mask for the data pattern (not shown).

The display device fabricating method further includes forming the first insulating layer 200 between the gate pad GP and the data pad DP. The display device fabricating method further includes forming the second insulating layer 300 on the data pad DP and the first insulating layer 200. The first insulating layer 200 and the second insulating layer 300 can be formed by depositing an organic insulating material or an inorganic insulating material. The second insulating layer 300 can be thicker than the first insulating layer 200. The widths of each of the data pad DP and the gate pad GP can be substantially the same.

Step S30 includes forming the black matrix BM and the transparent electrode TE on the substrate 100 having the gate pattern and the data pattern by using a first mask There can be a plurality of the black matrices BM and a plurality of the transparent electrodes TE.

The sum of the area S1 and the area S2 can be substantially equal to the area S3. One mask can be used to form the black matrix and the transparent electrode such that the sum and the area S3 are substantially the same.

Hereinafter, the forming of the black matrix BM and the transparent electrode TE in operation S30 is described in more detail.

Figure 7:
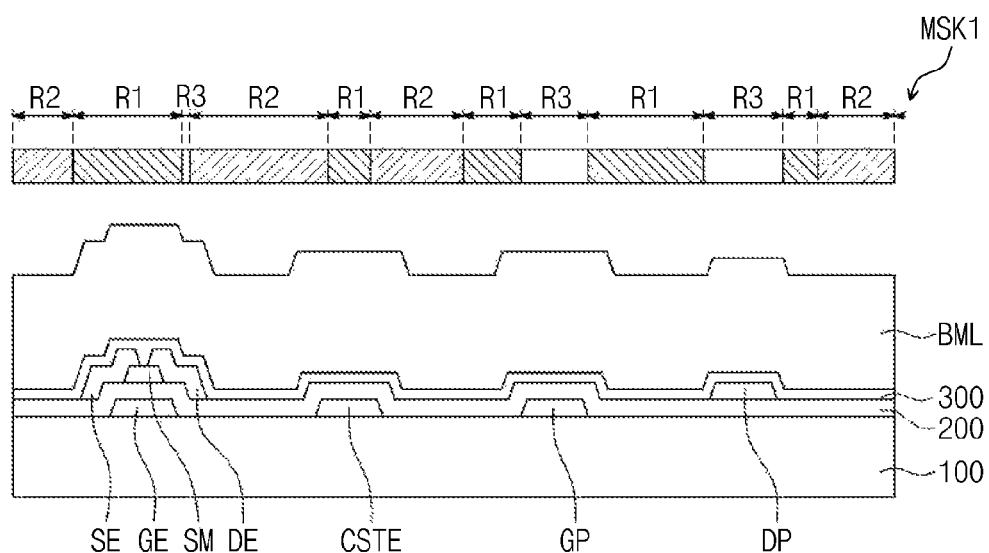

Referring to FIGS. 4 and 7, in step S100, a black matrix layer BML is formed on the substrate 100 having the gate pattern and the data pattern. The thickness of the black matrix layer BML can be made uniform.

The black matrix layer BML can be formed by coating an organic material on the substrate 100.

The forming of the black matrix includes planarizing the black matrix layer BML.

Figure 8:
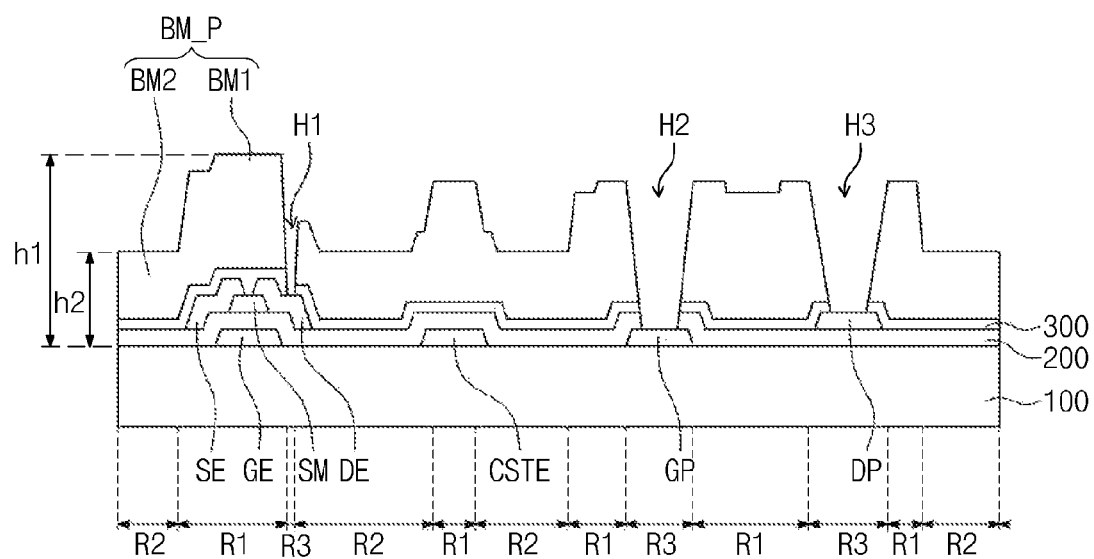

Referring to FIGS. 4, 7, and 8, in step S200, a portion of the black matrix layer BML is etched by using a first mask MSK1 to form the black matrix pattern BM_P.

The first mask MSK1 can be a halftone mask or a slit mask. The first mask MSK1 includes a first area R1 for substantially blocking emitted light, a second area R2 having a slit pattern for transmitting a portion of light and substantially blocking the remaining portion of the light, and a third area R3 for transmitting the emitted light. Only the light transmitted through the first mask MSK1 is radiated on the black matrix layer BML. The top surface of the substrate 100 can be divided into areas that are formed below and correspond to the areas R1, R2, and R3, respectively. Hereinafter, the corresponding areas of the substrate 100 are also referred to as the first area R1, the second area R2, and the third area R3, respectively.

The black matrix pattern BM_P includes a first black matrix BM1 corresponding to the first area R1 and a second black matrix BM2 corresponding to the second area R2.

When the black matrix layer BML is developed and exposed in step S200, portions of the first insulating layer 200 and the second insulating layer 300 are removed. That is, by removing the portions of the first and second insulating layers 200 and 300 and a portion of the black matrix layer BML substantially overlapping the portions, the gate contact hole H2, the drain contact hole H1 and the data contact hole H3 are further formed. The drain contact hole H1, the gate contact hole H2, and the data contact hole H3 correspond to the third area R3. In some embodiments, as shown in FIG. 8, the width of the drain contact hole H1 is less than the width of the gate contact hole H2. Also, the width of the gate contact hole H2 can be less than the width of the data contact hole H3. A first thickness h1 from the bottom surface of the first insulating layer 200 to the top surface of the black matrix BM1 can be greater than a second thickness h2 from the bottom surface of the first insulating layer 200 to the top surface of the second black matrix BM2.

Figure 9:
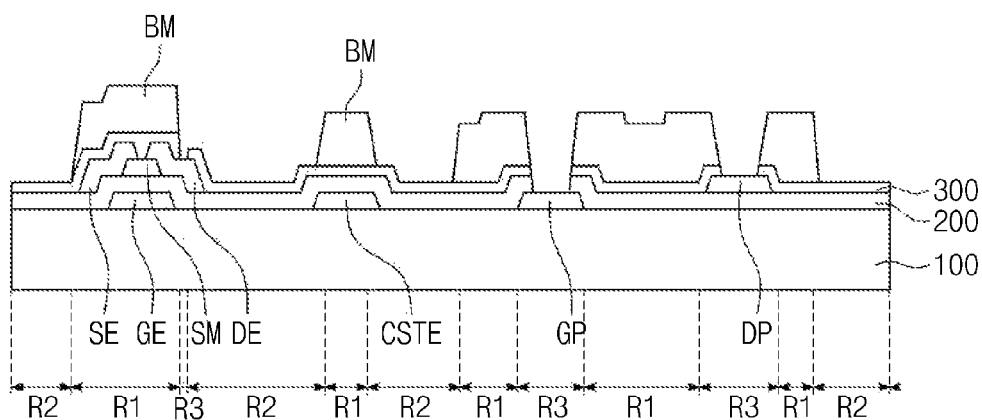

Referring to FIGS. 4 and 9, in step S300, the black matrix BM is formed by etching a portion of the black matrix pattern BM_P.

The forming of the black matrix BM is not limited to the above. For example, the forming can include etching a portion of the first black matrix BM1 and all of the second black matrix BM2 through a plasma ashing process or an etch back process. As a result, the black matrix BM is formed in regions corresponding to the second area R2.

Figure 10:
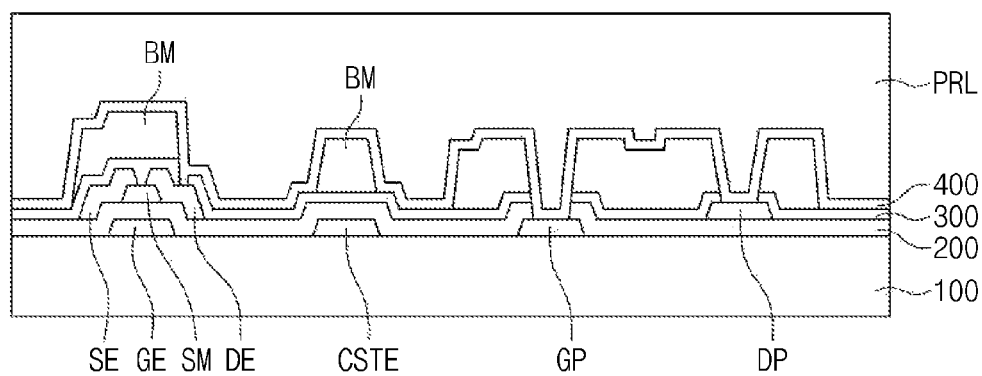

Referring to FIGS. 4 and 10, in step S400, a transparent electrode layer 400 is formed on the black matrix BM.

The transparent electrode layer 400 can be formed by coating Indium Tin Oxide (ITO), Indium Zinc Oxide (IZO), or Indium Gallium Zinc Oxide (IGZO) over the black matrix BM.

Referring to FIGS. 4 and 10, in step S500, a photoresist layer PRL is formed by coating a photoresist on the transparent electrode layer 400. The thickness of the transparent electrode layer 400 can be made uniform.

The forming of the photoresist layer PRL can include planarizing the photoresist layer PRL. The photoresist layer PRL can use a negative photoresist material such that an unexposed portion of the photoresist layer PRL is removed after etching. The photoresist PRL can use a positive photoresist layer PRL such that the unexposed portion of the photoresist layer PRL remains after etching. After the photoresist layer PRL is formed, the thickness of the TFT substrate 1000 can be made uniform.

Figure 11:
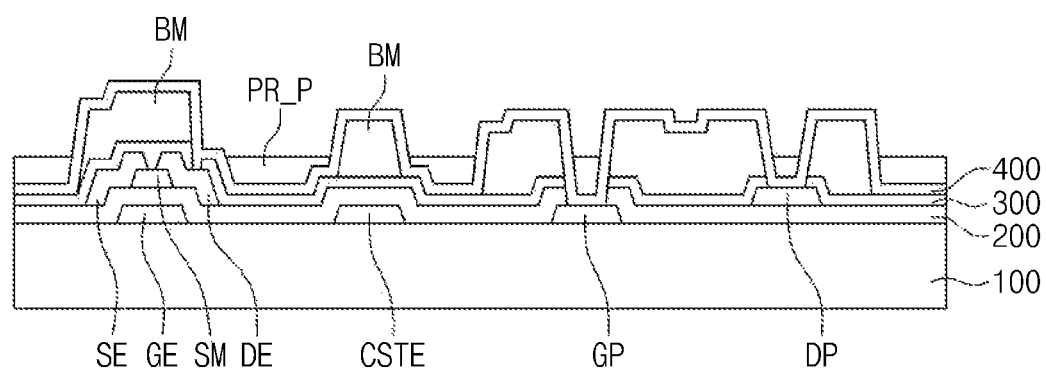

Referring to FIGS. 4 and 11, in step S600, a photoresist pattern PR_P exposing at least a portion of the transparent electrode layer 400 is formed by etching a portion of the photoresist layer PRL.

The forming of the photoresist pattern PR_P can be performed through a plasma ashing process or an etch back process. The photoresist pattern PR_P can be formed between the black matrices BM coated with the transparent electrode layer 400. The thicknesses of each of two adjacent black matrices BM can be greater than the thickness of the photoresist pattern PR_P formed therebetween.

Figure 12:
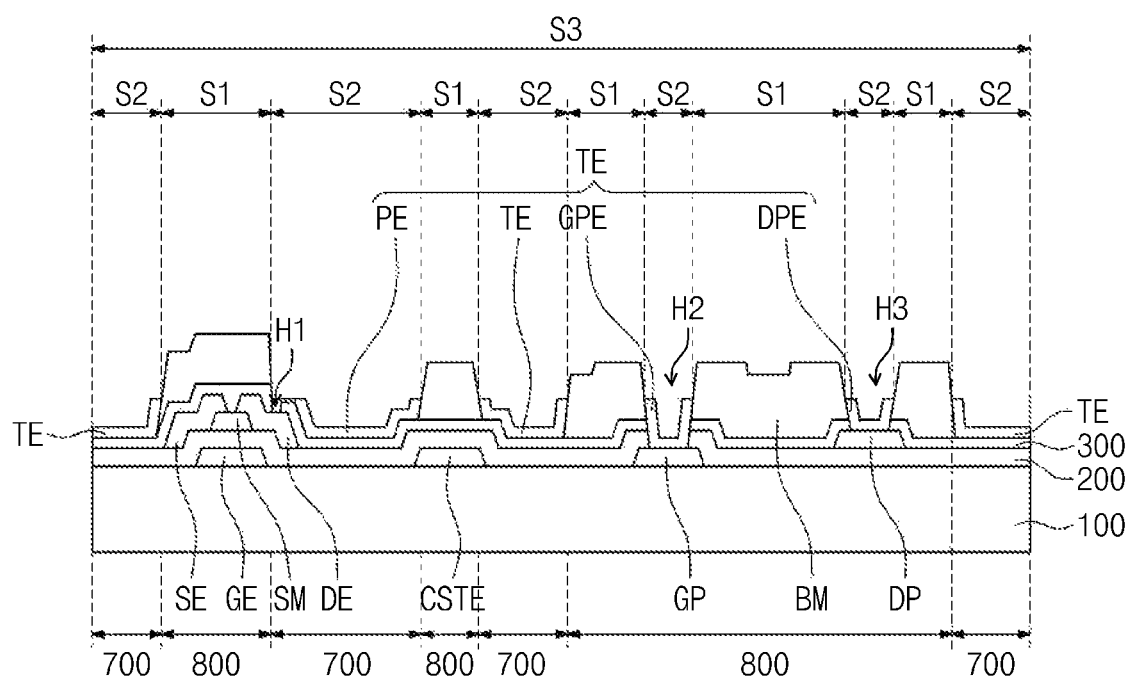

Referring to FIGS. 4 and 12, in step S700, the exposed transparent electrode layer 400 is etched by using the photoresist pattern as a mask.

The exposed transparent electrode layer 400 can be etched by a wet etch process such that the black matrix BM is not etched. A transparent electrode can be formed by etching the exposed transparent electrode layer 400.

Referring to FIGS. 4 and 12, in step S800, the photoresist pattern PR_P is removed.

The process of removing the photoresist pattern PR_P is not limited to the above and can be performed through a wet etch process. By completely removing the photoresist pattern PR_P, the top surfaces of the black matrix BM and the transparent electrode TE can be exposed.

In some embodiments, the display device fabricating method can include forming the TFT substrate 1000 with one mask. Therefore, because the number of masks used decreases, production costs can be reduced.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A display device, comprising:
    a substrate;
    a gate pattern including i) a gate electrode formed over the substrate, ii) a gate line extending in a first direction, and iii) a gate pad formed at one end of the gate line;
    a data pattern including i) a semiconductor pattern at least partially overlapping the gate electrode, ii) a source electrode contacting a portion of the semiconductor pattern, iii) a drain electrode contacting another portion of the semiconductor pattern and spaced apart from the source electrode, iv) a data line extending in a second direction crossing the first direction, and v) a data pad formed at one end of the data line;
    a black matrix formed over the substrate and having a first area; and
    a transparent electrode formed over the substrate and having a second area,
    wherein the sum of the first and second areas is substantially equal to the surface area of the substrate.

2. The device of claim 1, wherein the substrate comprises at least one display area configured to display an image and at least one non-display area.

3. The device of claim 2, wherein the black matrix comprises a plurality of portions formed in the non-display area.

4. The device of claim 3, wherein the transparent electrode comprises a plurality of portions formed in the display area and the remaining portions of the non-display area.

5. The device of claim 1, further comprising:
    a first insulating layer formed between the gate pattern and the data pattern; and
    a second insulating layer formed over the first insulating layer.

6. The device of claim 5, wherein a contact hole overlapping a portion of the gate pad is formed in the first and second insulating layers,
    wherein a drain contact hole overlapping a portion of the drain electrode and a data contact hole overlapping a portion of the data pad are further formed in the second insulating layer.

7. The device of claim 6, wherein the transparent electrode comprises:
    a pixel electrode electrically connected to the drain electrode via the drain contact hole;
    a gate pad electrode electrically connected to the gate pad via the gate contact hole; and
    a data pad electrode electrically connected to the data pad via the data contact hole.

8. The device of claim 1, wherein the black matrix is formed of an organic material.

9. The device of claim 1, wherein the first area comprises a projection onto the substrate and wherein the second area comprises a projection onto the substrate.

10. A display device, comprising:
    a substrate;
    a black matrix formed over the substrate and having a first area; and
    a transparent electrode formed over the substrate and having a second area,
    wherein the sum of the first and second areas is substantially equal to the surface area of the substrate.

11. The device of claim 10, wherein the first area comprises a projection onto the substrate and wherein the second area comprises a projection onto the substrate.

12. The device of claim 10, wherein the substrate comprises at least one display area configured to display an image and at least one non-display area, and wherein the black matrix comprises a plurality of portions formed in the non-display area.

13. The device of claim 12, wherein the transparent electrode comprises a plurality of portions formed in the display area and the remaining portions of the non-display area.

* * * * *